(12) United States Patent
Hattaha et al.

(10) Patent No.: US 11,946,992 B2
(45) Date of Patent: Apr. 2, 2024

(54) MAGNETIC RESONANCE APPARATUS WITH A MAIN MAGNET DISPOSED BETWEEN EXAMINATION ROOMS

(71) Applicant: CANON MEDICAL SYSTEMS CORPORATION, Otawara (JP)

(72) Inventors: Misaki Hattaha, Sakura (JP); Sadanori Tomiha, Nasushiobara (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 0 days.

(21) Appl. No.: 17/657,209

(22) Filed: Mar. 30, 2022

(65) Prior Publication Data

US 2022/0317212 A1   Oct. 6, 2022

(30) Foreign Application Priority Data

Apr. 1, 2021   (JP) .................................. 2021-062583

(51) Int. Cl.
| | |
|---|---|
| G01R 33/36 | (2006.01) |
| G01R 33/24 | (2006.01) |
| G01R 33/38 | (2006.01) |
| G01R 33/385 | (2006.01) |

(52) U.S. Cl.
CPC ....... G01R 33/3685 (2013.01); G01R 33/246 (2013.01); G01R 33/3802 (2013.01); G01R 33/3856 (2013.01)

(58) Field of Classification Search
CPC .............. G01R 33/246; G01R 33/3685; G01R 33/3802; G01R 33/3856; G01R 33/3806; G01R 33/3815; G01R 33/422
See application file for complete search history.

(56) References Cited

U.S. PATENT DOCUMENTS

| | | | |
|---|---|---|---|
| 5,490,513 A | * | 2/1996 | Damadian ........ G01R 33/34046 324/309 |
| 5,606,970 A | * | 3/1997 | Damadian ............ G01R 33/381 324/309 |

(Continued)

FOREIGN PATENT DOCUMENTS

| | | | |
|---|---|---|---|
| JP | 61159950 A | * | 7/1986 |
| JP | 10234704 A | * | 9/1998 |
| JP | 2014-94267 A | | 5/2014 |

*Primary Examiner* — Jay Patidar
(74) *Attorney, Agent, or Firm* — Oblon, McClelland, Maier & Neustadt, L.L.P.

(57) ABSTRACT

In one embodiment, an MRI system includes at least one magnetic field assembly and at least one image generator. The at least one magnetic field assembly includes an open main magnet configured to generate a main magnetic field for dominantly determining a magnetic resonance frequency, a gradient coil configured to generate a gradient magnetic field, and an RF coil configured to generate a radio frequency magnetic field. The at least one image generator is configured to generate a magnetic resonance image of an object by using the main magnetic field, the gradient magnetic field, and the radio frequency magnetic field generated by the at least one magnetic field assembly. The main magnet is disposed between adjacent examination rooms. The main magnetic field generated by the open main magnet is commonly used in each of the adjacent examination rooms.

17 Claims, 11 Drawing Sheets

(56) References Cited

U.S. PATENT DOCUMENTS

| | | | | |
|---|---|---|---|---|
| 5,614,880 | A | * | 3/1997 | Palkovich ............ G01R 33/383 |
| | | | | 324/318 |
| 5,842,987 | A | * | 12/1998 | Sahadevan ............... A61B 6/04 |
| | | | | 600/407 |
| 6,782,571 | B1 | * | 8/2004 | Josephson ................ A61B 6/04 |
| | | | | 5/601 |
| 8,898,830 | B2 | * | 12/2014 | Hushek .................. A61G 7/103 |
| | | | | 5/81.1 R |
| 2009/0124884 | A1 | * | 5/2009 | Saunders ........... G01R 33/3875 |
| | | | | 600/410 |
| 2014/0128724 | A1 | | 5/2014 | Dahan et al. |

* cited by examiner

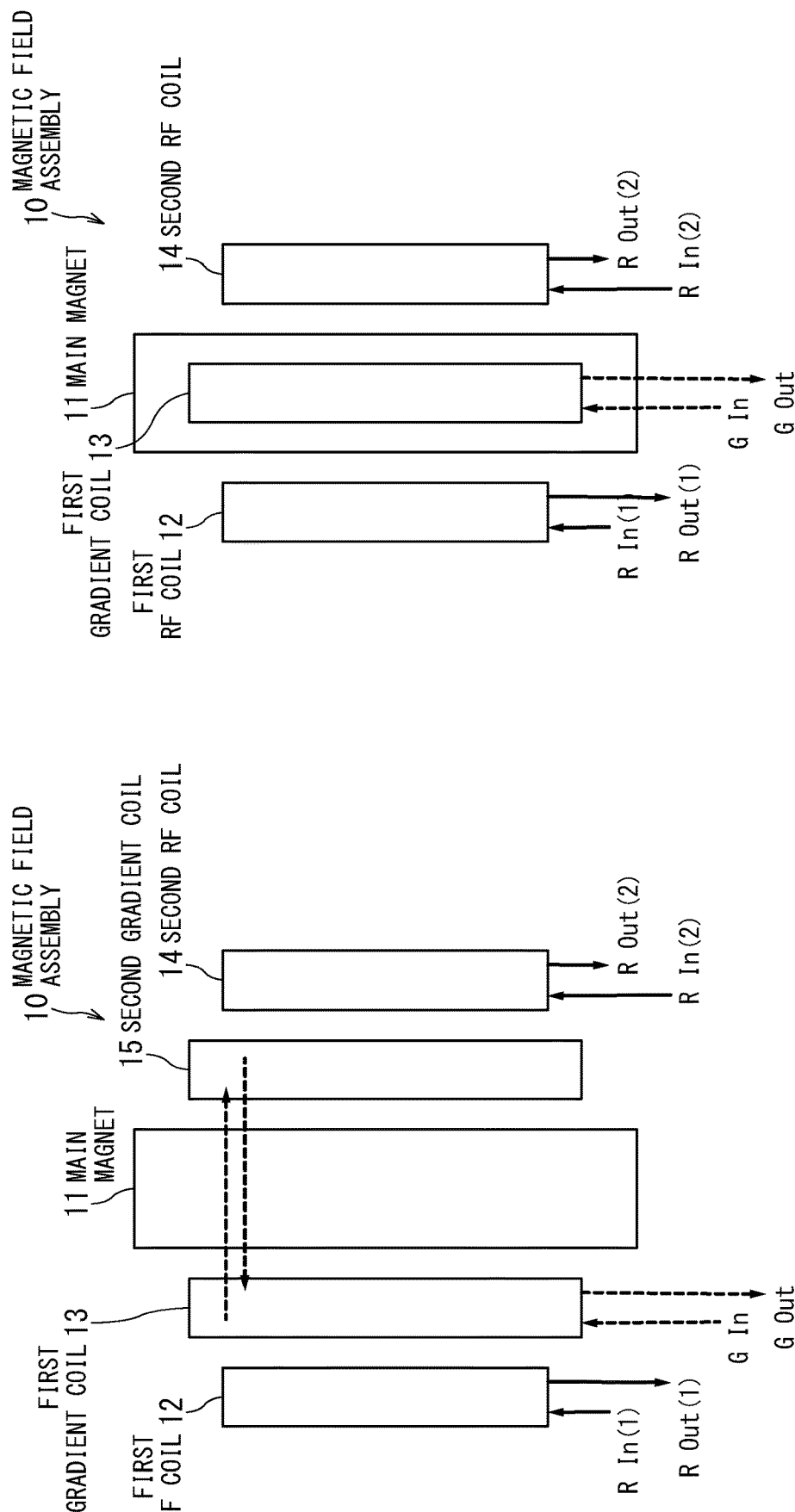

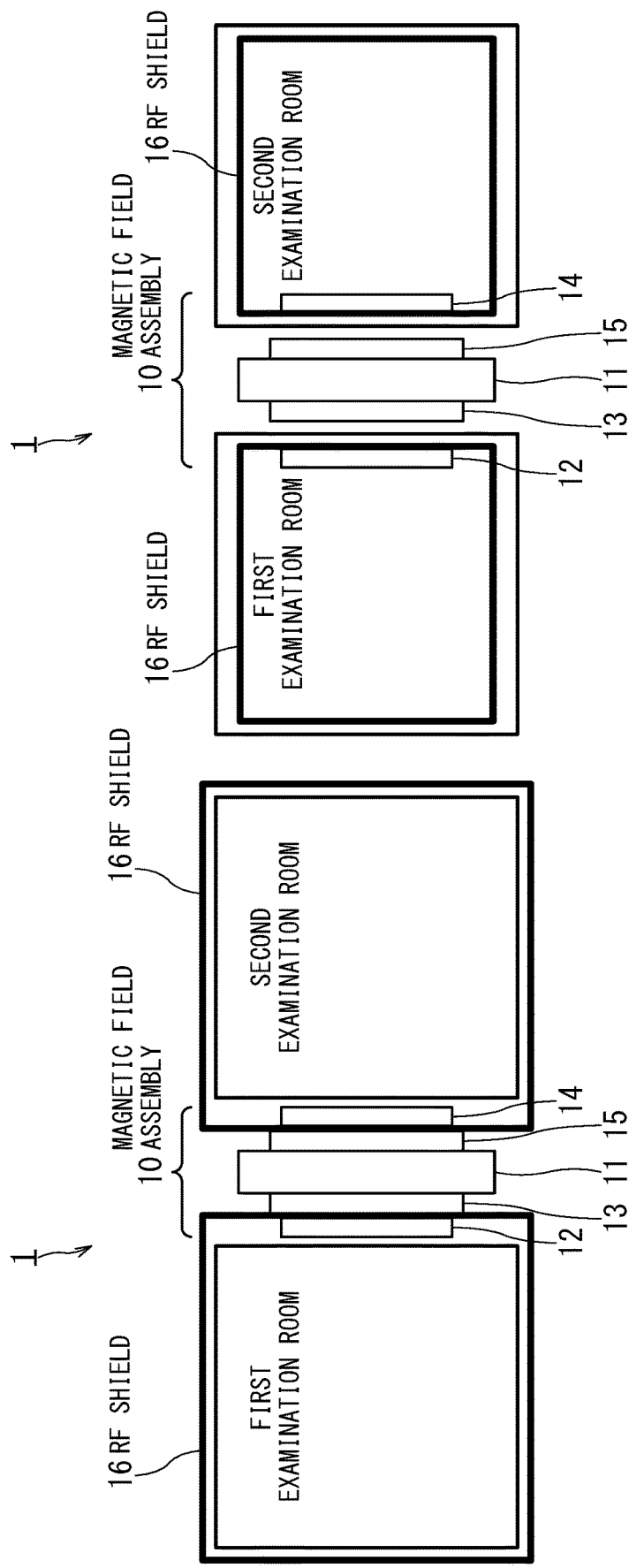

MAGNETIC RESONANCE APPARATUS WITH A MAIN MAGNET DISPOSED BETWEEN EXAMINATION ROOMS

CROSS-REFERENCE TO RELATED APPLICATIONS

This application claims the benefit of priority of Japanese Patent Application No. 2021-062583, filed Apr. 1, 2021, the entire contents of which are incorporated herein by reference.

FIELD

Embodiments described herein relate generally to a magnetic resonance imaging (MRI) system.

BACKGROUND

An MRI apparatus is an imaging apparatus which magnetically excites nuclear spin of an object placed in a static magnetic field with a radio frequency (RF) pulse having the Larmor frequency and reconstructs an image on the basis of magnetic resonance (MR) signals emitted from the object due to the excitation.

Many MRI apparatuses have a configuration called a gantry. A cylindrical space called a bore is formed in the gantry. An object (for example, a patient) lying on a top plate is imaged while being carried into a cylindrical space. The gantry houses a cylindrical static magnetic field magnet, a cylindrical gradient coil (i.e., gradient magnetic field coil), and a cylindrical RF coil, i.e., a WB (Whole Body) coil. In many conventional MRI apparatuses of this structure, since the static magnetic field magnet, the gradient coil, and the RF coil are formed into a cylindrical shape, an MRI apparatus with this structure is hereinafter referred to as a cylindrical MRI apparatus.

Since the cylindrical MRI apparatus images an object such as a patient in the closed space in the bore, imaging may be difficult for some patients having claustrophobia, for example.

In another proposed MRI apparatus under development, the static magnetic field magnets, the gradient coil, and the RF coil are formed in the shape of a flat plate so that imaging of an object such as a patient is performed in the open space sandwiched between two planar static magnetic field magnets. An MRI apparatus of this structure is hereinafter referred to as a planar open magnet MRI apparatus or simply referred to as an open magnet MRI apparatus. In the open magnet MRI apparatus, imaging is performed in the open space, and thus, a patient having claustrophobia can be imaged.

In the open magnet MRI apparatus, the magnetic field of planar static magnetic field magnets is generated not only on the side facing the imaging space where the patient is present but also on the opposite side of the imaging space, i.e., outside the imaging space.

Conventionally, the magnetic field generated outside the imaging space has not been effectively used but rather has been deemed harmful, requiring equipment such as a magnetic field shield for suppressing it.

BRIEF DESCRIPTION OF THE DRAWINGS

FIG. 10A and FIG. 10B are schematic diagrams illustrating configurations, in each of which a radio frequency magnetic field is controlled independently in each of the two adjacent examination rooms while the same gradient magnetic field is commonly used in the two adjacent examination rooms; and FIG. 11A and FIG. 11B are schematic diagrams illustrating configurations, in each of which an RF shield is provided to further suppress mutual interference of RF signals between adjacent examination rooms.

DETAILED DESCRIPTION

Hereinbelow, the embodiments of the present invention will be described by referring to the accompanying drawings.

In one embodiment, an MRI system includes at least one magnetic field assembly and at least one image generator. The at least one magnetic field assembly includes an open main magnet configured to generate a main magnetic field for dominantly determining a magnetic resonance frequency, a gradient coil configured to generate a gradient magnetic field, and an RF coil configured to generate a radio frequency magnetic field. The at least one image generator is configured to generate a magnetic resonance image of an object by using the main magnetic field, the gradient magnetic field, and the radio frequency magnetic field generated by the at least one magnetic field assembly. The main magnet is disposed between adjacent examination rooms. The main magnetic field generated by the open main magnet is commonly used in each of the adjacent examination rooms.

First Embodiment

Prior to presenting the MRI system 1 according to the first embodiment, a description will be given of a conventional open magnet MRI apparatus.

Figure 1:
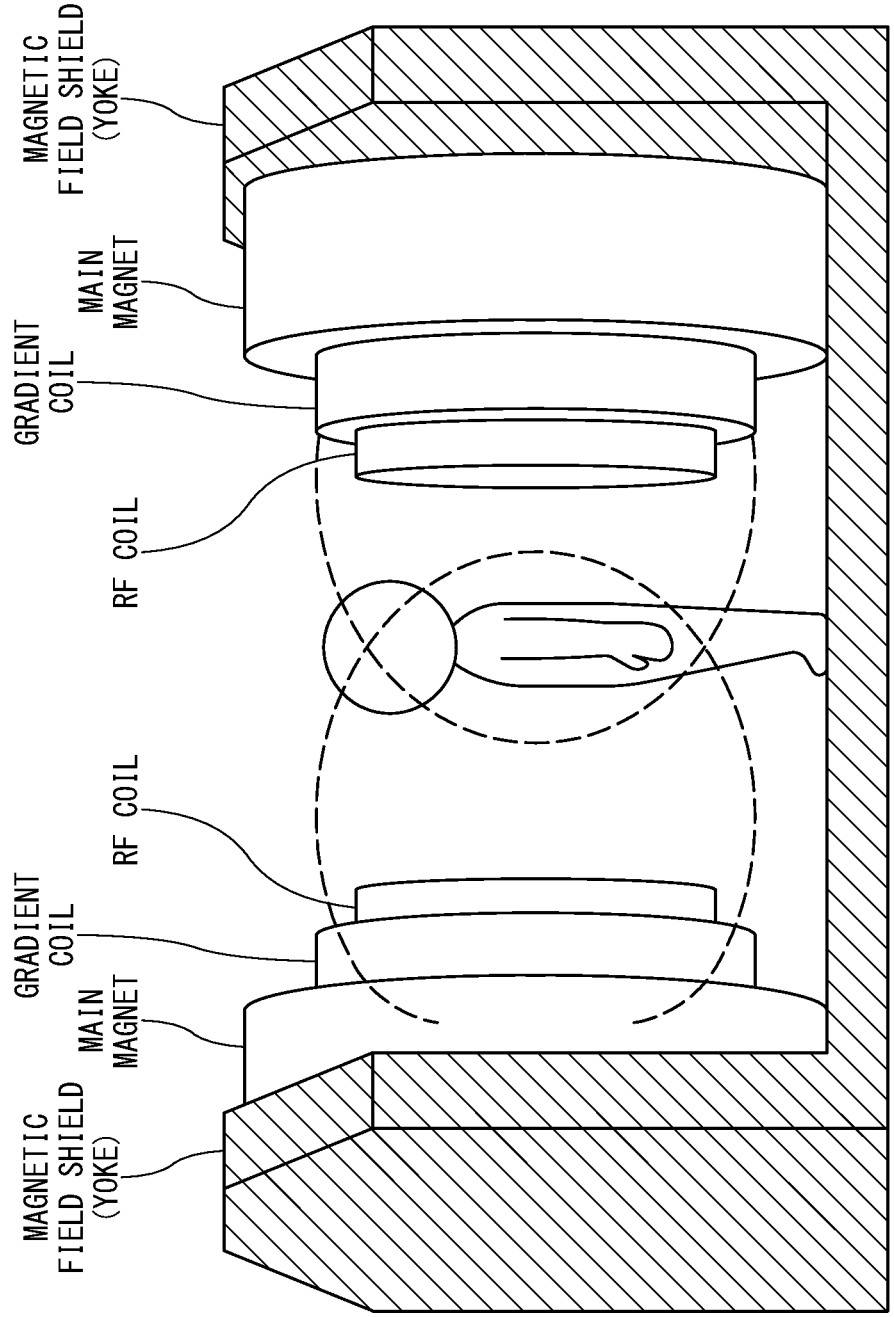
FIG. 1 is a schematic diagram illustrating a configuration of a conventional open magnet MRI apparatus.

FIG. 1 is a schematic diagram illustrating a configuration of a conventional open magnet MRI apparatus. The conventional MRI apparatus has, for example, two main magnets in the shape of a circular flat plate (i.e., thin cylindrical shape).

The two main magnets are disposed so as to sandwich the object. This disposition of the main magnets generates a magnetic field in the open imaging space between the two main magnets. For each of the two main magnets, gradient coils and RF coils formed in a circular flat plate shape similar to the main magnets are provided at positions toward the imaging space, for example.

The object is imaged in an open imaging space sandwiched between a pair of main magnets, a pair of gradient coils, and a pair of RF coils. In FIG. 1, the substantially arcuate broken lines extending from the main magnets schematically shows the static magnetic field generated by the main magnets.

As described above, in the main magnets of a conventional open magnet MRI apparatus, the main magnets generate the static magnetic field not only on the side toward the imaging space where the object (for example, the patient) is present but also on the opposite side of the imaging space, i.e., outside the imaging space.

Conventionally, the magnetic field generated outside the imaging space has not been effectively used but, rather has been considered harmful. Thus, as illustrated in FIG. 1, a yoke for suppressing an unnecessary static magnetic field toward the outside of the imaging space is provided as a magnetic field shield.

In contrast, the MRI system of each embodiment described below can use the static magnetic field in both regions. That is, the MRI system of each embodiment can effectively utilize not only the static magnetic field generated on the side toward the imaging space but also the static magnetic field generated on the opposite side of the imaging space (i.e., outside the imaging space).

Figure 2:
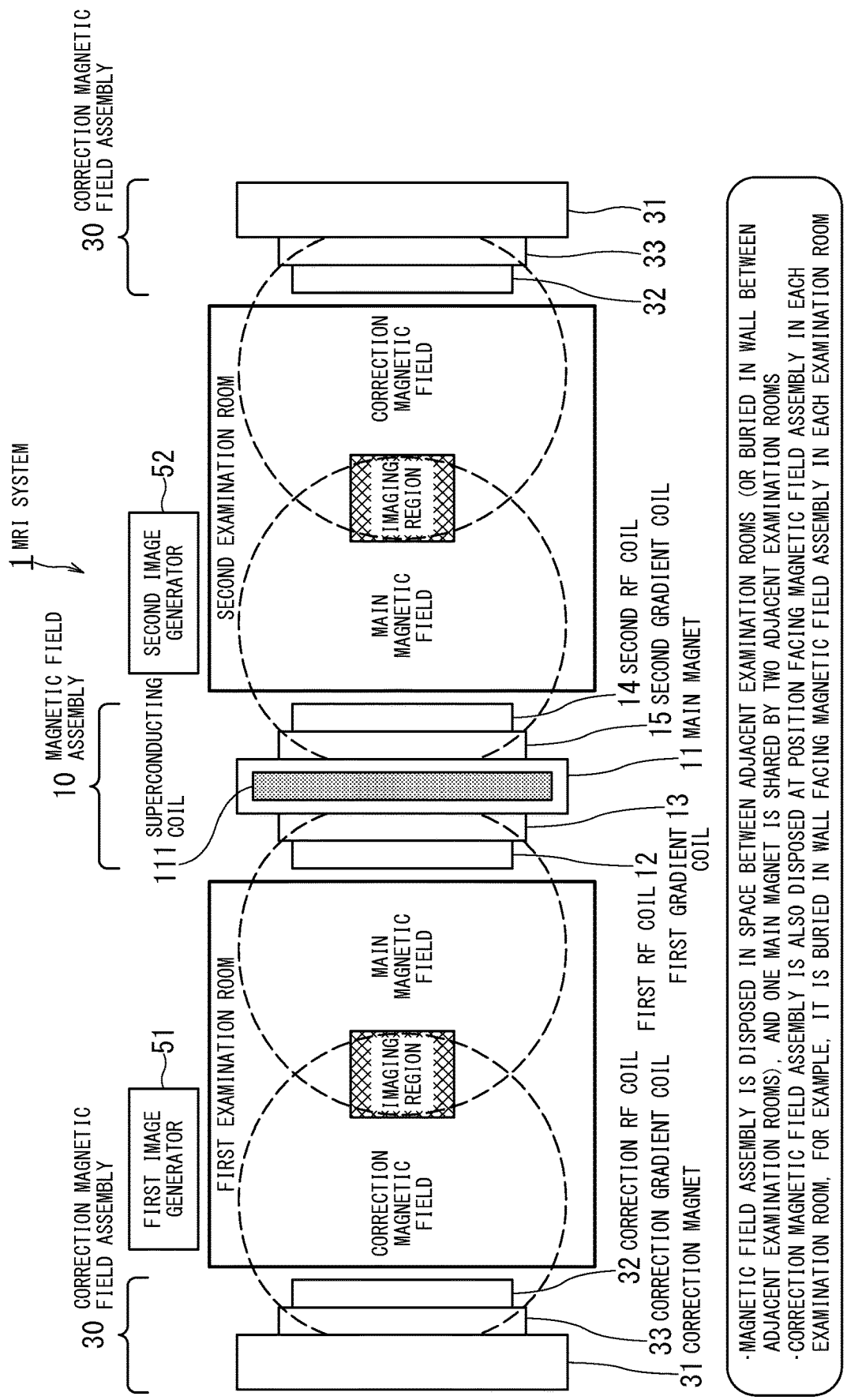
FIG. 2 is a schematic diagram illustrating a configuration of an MRI system according to the first embodiment.

FIG. 2 is a schematic diagram illustrating a configuration of the MRI system 1 according to the first embodiment. The MRI system 1 includes: one or more magnetic field assembly 10 disposed between a plurality of examination rooms adjacent to each other; and a plurality of image generators that are provided so as to correspond to the respective examination rooms adjacent to each other.

FIG. 2 may be regarded as a view of the respective examination rooms and the magnetic field assembly 10 from above or from a side. Although FIG. 3 to FIG. 8 (except FIG. 4) similar to FIG. 2 in the following description may also be considered as a view of the respective examination rooms and the magnetic field assembly 10 from above or from a side.

In the case of FIG. 2, one magnetic field assembly 10 is disposed in the space between the first examination room and the second examination room adjacent to each other. The magnetic field assembly 10 may be buried in the wall between the first examination room and the second examination room. Additionally, an installation space of a predetermined size may be provided in the wall between the first examination room and the second examination room so that the magnetic field assembly 10 is disposed in the installation space.

In the magnetic field assembly 10, a main magnet 11 is disposed in the central portion. A first gradient coil 13 and a first RF coil 12 are disposed on the side of the first examination room, and a second gradient coil 15 and a second RF coil 14 are disposed on the side of the second examination room such that the main magnet 11 is interposed between the first and second gradient coils 13 and 15. The main magnet 11, the first and second gradient coils 13 and 15, and the first and second RF coils 12 and 14 are formed in a cylindrical shape having a predetermined thickness, for example.

The main magnet 11 generates a main magnetic field that dominantly determines the magnetic resonance frequency.

The "main magnetic field that dominantly determines the magnetic resonance frequency" means a magnetic field that determines the magnetic resonance frequency in a state where the magnetic field generated by the gradient coil and the magnetic field generated by the RF coil are not superimposed. Although the main magnetic field is not necessarily required to have a constant magnetic field strength over time, the main magnetic field is generated only by the main magnet 11.

Further, the main magnet 11 of the present embodiment is an open main magnet. The open main magnet such as the main magnet 11 can form an open imaging space where, for example, there is no obstacle (such as a static magnetic field magnet and a gradient coil) close to the object in at least three of the six directions including the up, down, left, right, front, and back directions around the object.

The main magnet 11 has, for example, a superconducting coil 111 in its inside, and the main magnetic field is generated by causing an electric current to flow through the superconducting coil 111. The main magnet 11 may be configured of a superconducting coil 111 as shown in FIG. 2 or may be configured of a normal conducting coil instead of the superconducting coil 111.

When the main magnet 11 is configured of the superconducting coil 111, a static magnetic field is generated by applying the current supplied from the main magnet power supply to the superconducting coil 111 in an excitation mode. Afterward, when the main magnet 11 shifts to a permanent current mode, the main magnet power supply is disconnected and the main magnet 11 continues to generate a magnetic field of constant strength, i.e., a static magnetic field.

It is also conceivable to apply a drive current from the main magnet power supply to the superconducting coil 111 and change the magnetic field strength by controlling the drive current without causing the main magnet to shift to the permanent current mode. Even when the main magnet 11 is configured of the normal conducting coil, the magnetic field strength can be changed by controlling the drive current to be applied to the normal conducting coil. In such an operation, the magnetic field strength of the magnetic field generated by the main magnet 11 can be changed, and the magnetic field generated by the main magnet 11 is not strictly a static magnetic field. For this reason, in the present specification, the magnetic field generated by the main magnet 11 is referred to as a "main magnetic field" instead of a "static magnetic field".

Since the main magnet 11 is disposed between the two adjacent examination rooms, one main magnet 11 can be shared by the two adjacent examination rooms. For example, when a current is applied to the superconducting coil 111 constituting the main magnet 11, the main magnetic field is generated simultaneously in both of the first examination room and the second examination room. As a result, the main magnetic field generated by the main magnet 11 can be commonly used in each of the examination rooms that are adjacent to each other.

The gradient magnetic field coil and the RF coil are provided separately for each of the two adjacent examination rooms. For example, when the first examination room and the second examination room are adjacent to each other as shown in FIG. 2, the first gradient magnetic field used in the first examination room is generated by the first gradient coil 13 that is disposed on the side of the first examination room, while the second gradient magnetic field used in the second examination room is generated by the second gradient coil 15 that is disposed on the side of the second examination room.

The first radio frequency magnetic field to be used in the first examination room is generated by the first RF coil 12 disposed between the main magnet 11 and the first examination room, while the second radio frequency magnetic field to be used in the second examination room is generated by the second RF coil 14 disposed between the main magnet 11 and the second examination room.

In terms of improving the uniformity of the main magnetic field distribution in the imaging region in each examination room (for example, the hatched region in the center of each examination room in FIG. 2), two correction magnets 31 can be disposed on the opposite side of the main magnet 11 in the respective first and second examination rooms such that each examination room is interposed between the main magnet 11 and the correction magnet 31, for example.

Also, in terms of improving the uniformity of the gradient magnetic field distribution and the radio frequency magnetic field distribution, a correction gradient-magnetic-field coil (hereinafter simply referred to as a correction gradient coil) 33 and a correction RF coil 32 may be disposed at positions facing the first gradient coil 13 and the first RF coil 12 so that the first examination room is interposed between these correction coils 32, 33 and the coils 12, 13 of the magnetic field assembly 10. Similarly, another correction gradient coil 33 and another correction RF coil 32 may be disposed at positions facing the second gradient coil 15 and the second RF coil 14 so that the second examination room is interposed between these coils 32, 33 for correction and the coils 14, 15 of the magnetic field assembly 10.

Each of the two correction magnetic field assemblies 30 shown in FIG. 2 is composed of the correction magnet 31, the correction gradient coil 33, and the correction RF coil 32. The two correction magnetic field assemblies 30 may be buried in the respective walls of the first examination room and the second examination room at positions facing the magnetic field assembly 10 or may be provided in the vicinity of the respective walls facing the magnetic field assembly 10 (for example, outside or inside the respective walls of the first examination and second examination rooms).

Also, each examination room may be provided with an image generator that generates a magnetic resonance image by using the main magnetic field, the gradient magnetic field, and the radio frequency magnetic field. For example, as shown in FIG. 2, a first image generator 51 corresponding to the first examination room is provided, and a second image generator 52 corresponding to the second examination room is provided.

The first image generator 51 includes, for example, a sequence controller, a reconstruction processing circuit, an image processing circuit, and a display. The sequence controller of the first image generator 51 controls magnitude and timing of a transmission RF pulse to be applied to the first RF coil 12 and a gradient magnetic field current to be applied to the first gradient coil 13 on the basis of the determined pulse sequence, for example. The reconstruction processing circuit of the first image generator 51 reconstructs magnetic resonance signals received by the first RF coil 12 or a local reception coil (not shown) installed in the first examination room so as to generate a magnetic resonance image. The display displays the generated magnetic resonance image.

The second image generator 52 has the same configuration as the first image generator 51. The sequence controller of the second image generator 52 controls magnitude and timing of a transmission RF pulse to be applied to the second RF coil 14 and a gradient magnetic field current to be applied to the second gradient coil 15 on the basis of the determined pulse sequence, for example. The reconstruction processing circuit of the second image generator 52 reconstructs magnetic resonance signals received by the second RF coil 14 or a local reception coil (not shown) installed in the second examination room so as to generate a magnetic resonance image.

The above-described sequence controller and reconstruction processing circuit can be configured by including a processor, which implements each of the above-described functions by executing predetermined programs, and/or hardware, which implements each of the above-described functions, as exemplified by an FPGA (Field Programmable Gate Array) or an ASIC (Application Specific Integrated Circuit)

According to the MRI system 1 of the first embodiment described above, the main magnetic field generated by the main magnet 11 can be effectively used in two adjacent examination rooms. Since the main magnetic field generated by the main magnet 11 is effectively used not only on the front side of the main magnet 11 (for example, the side of the first examination room in FIG. 2) but also on the rear side of the main magnet 11 (for example, the side of the second examination room in FIG. 2), it is not necessary to provide a magnetic field shield on either the front side or the rear side of the main magnet 11.

Modifications of First Embodiment

Figure 3:
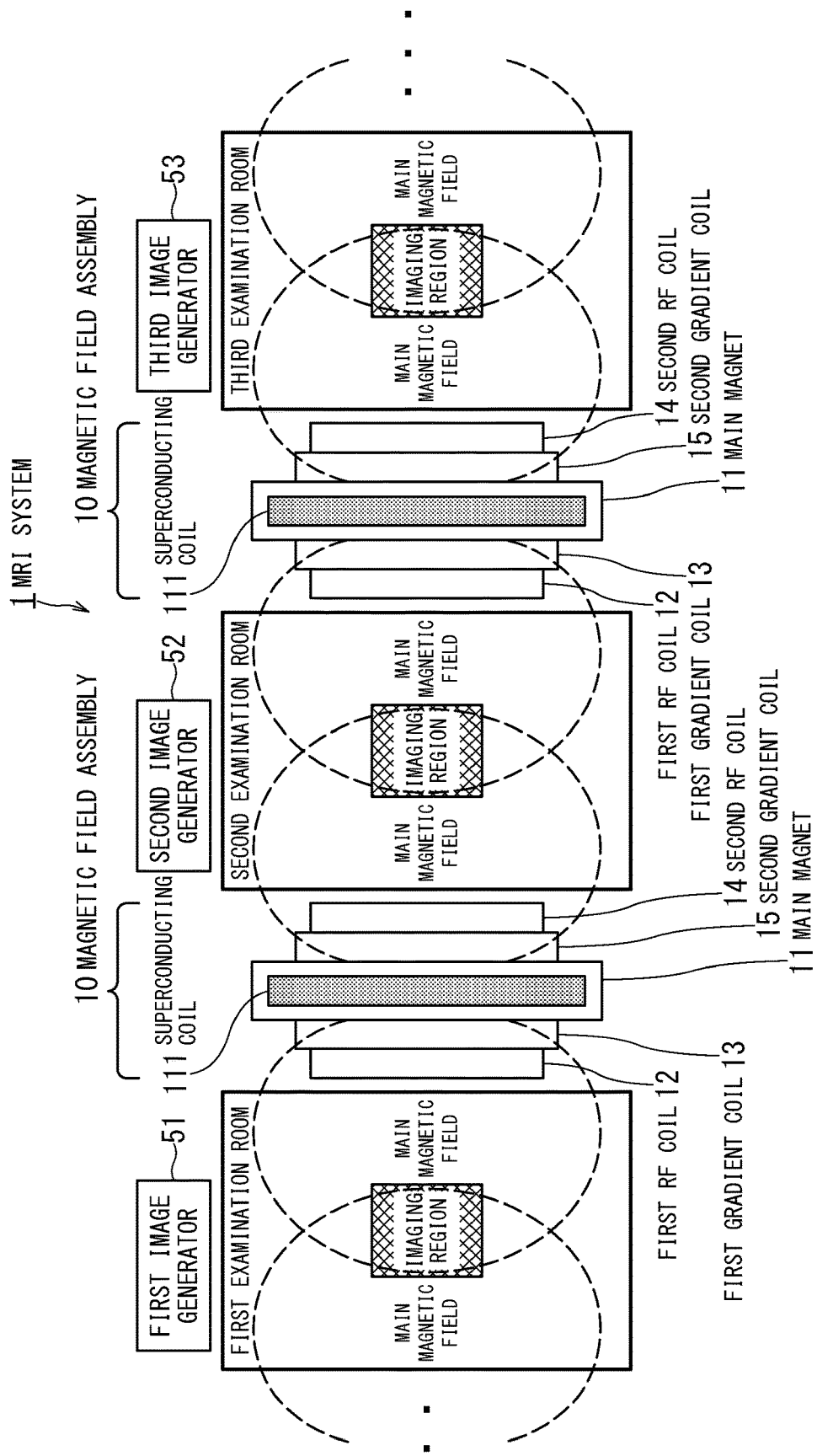
FIG. 3 is a schematic diagram illustrating a configuration of an MRI system according to the first modification of the first embodiment.

FIG. 3 is a schematic diagram illustrating a configuration of the MRI system 1 according to the first modification of the first embodiment. In the first embodiment shown in FIG. 2, one magnetic field assembly 10 is configured to enable imaging in two examination rooms (i.e., first examination room and second examination room). However, the number of magnetic field assemblies 10 may be two or more, and the number of examination rooms in which magnetic resonance imaging can be performed becomes three or more.

For example, as shown in FIG. 3, one magnetic field assembly 10 can be disposed between the first examination room and the second examination room, and another magnetic field assembly 10 can be disposed between the second examination room and the third examination room. Furthermore, in the case of repeating the disposition of the magnetic field assemblies 10 and the examination rooms in the left or right direction as shown in FIG. 3, the number of magnetic field assemblies 10 included in the first modification of the MRI system 1 can be increased.

Figure 4:
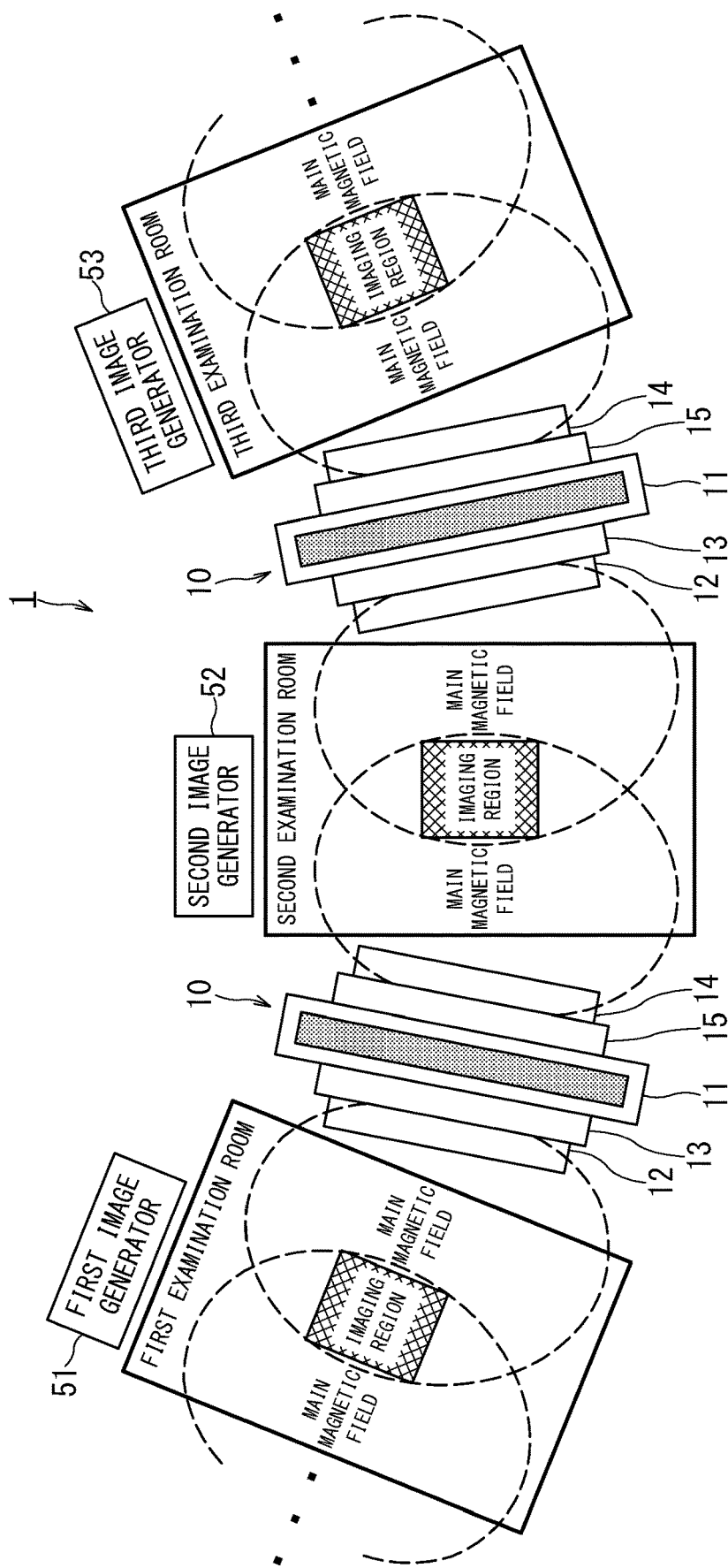
FIG. 4 is a schematic diagram illustrating a configuration of an MRI system according to the second modification of the first embodiment.

FIG. 4 is a schematic diagram illustrating a configuration of the MRI system 1 according to the second modification of the first embodiment. Although the plurality of magnetic field assemblies 10 and the plurality of examination rooms are arranged linearly in the first modification shown in FIG. 3, these magnetic field assemblies 10 and examination rooms are not limited to the linear arrangement but may be arranged in a curved shape. For example, as shown in FIG. 4, a plurality of magnetic field assemblies 10 and a plurality of examination rooms may be arranged in an arc shape.

According to the first modification or the second modification of the first embodiment, the MRI system 1 can be configured to flexibly match the number and the arrangement shape of the examination rooms in the building.

Second Embodiment

Figure 5:
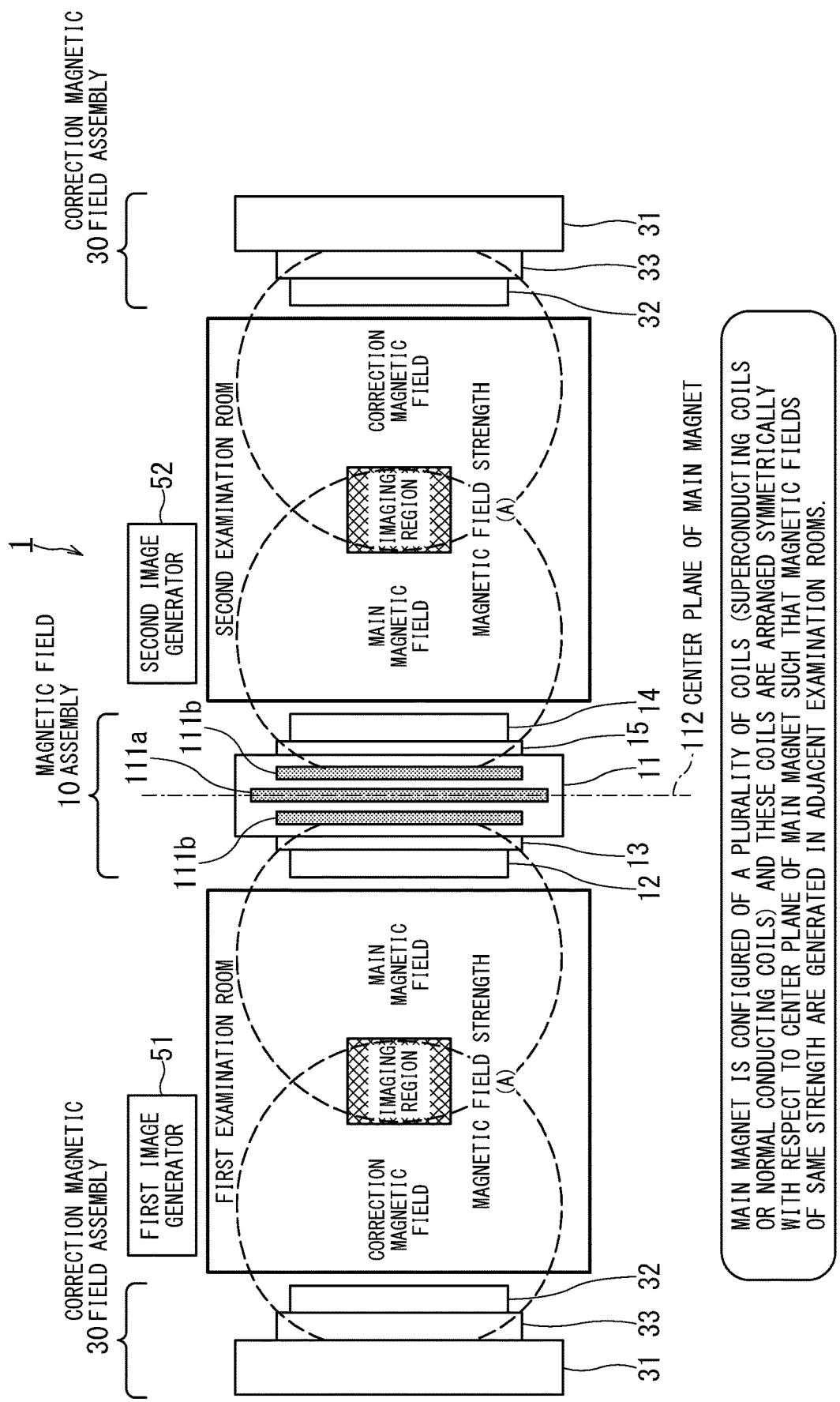
FIG. 5 is a schematic diagram illustrating a configuration of an MRI system according to the first example of the second embodiment.

FIG. 5 is a schematic diagram illustrating a configuration of the MRI system 1 according to the first example of the second embodiment. In the MRI system 1 according to the first example of the second embodiment, the main magnet 11 includes a plurality of superconducting coils or a plurality of normal conducting coils, which are arranged symmetrically with respect to the central plane of the main magnet 11.

For example, as illustrated in FIG. 5, the main magnet 11 includes one superconducting coil 111a and two superconducting coils 111b. The coil surface of one superconducting coil 111a is arranged so as to match the central plane of the main magnet 11, and each of the two superconducting coils 111b is arranged symmetrically with respect to the central plane of the main magnet 11.

The central plane of the main magnet 11 is parallel to the bottom plane or the top plane of the cylindrical main magnet 11 and passes through the center in the thickness direction of the main magnet 11. The coil surface is a plane that covers the entire circumference of the loop-shaped conducting wire, which constitutes the superconducting coil (or normal conducting coil), under the assumption that the loop-shaped conducting wire is sufficiently small in thickness, including the case where a plurality of conducting wires constitute the superconducting coil or normal conducting coil.

Since the main magnet 11 is composed of a plurality of superconducting coils (or normal conducting coils) and the plurality of superconducting coils (or normal conducting coils) are arranged symmetrically with respect to the central plane of the main magnet 11, a magnetic field of the same magnetic field strength (A) can be generated for the imaging region of each of the two adjacent examination rooms, and a magnetic field distribution having a symmetric profile with respect to the central plane of the main magnet 11 area available for the two adjacent examination rooms.

Figure 6:
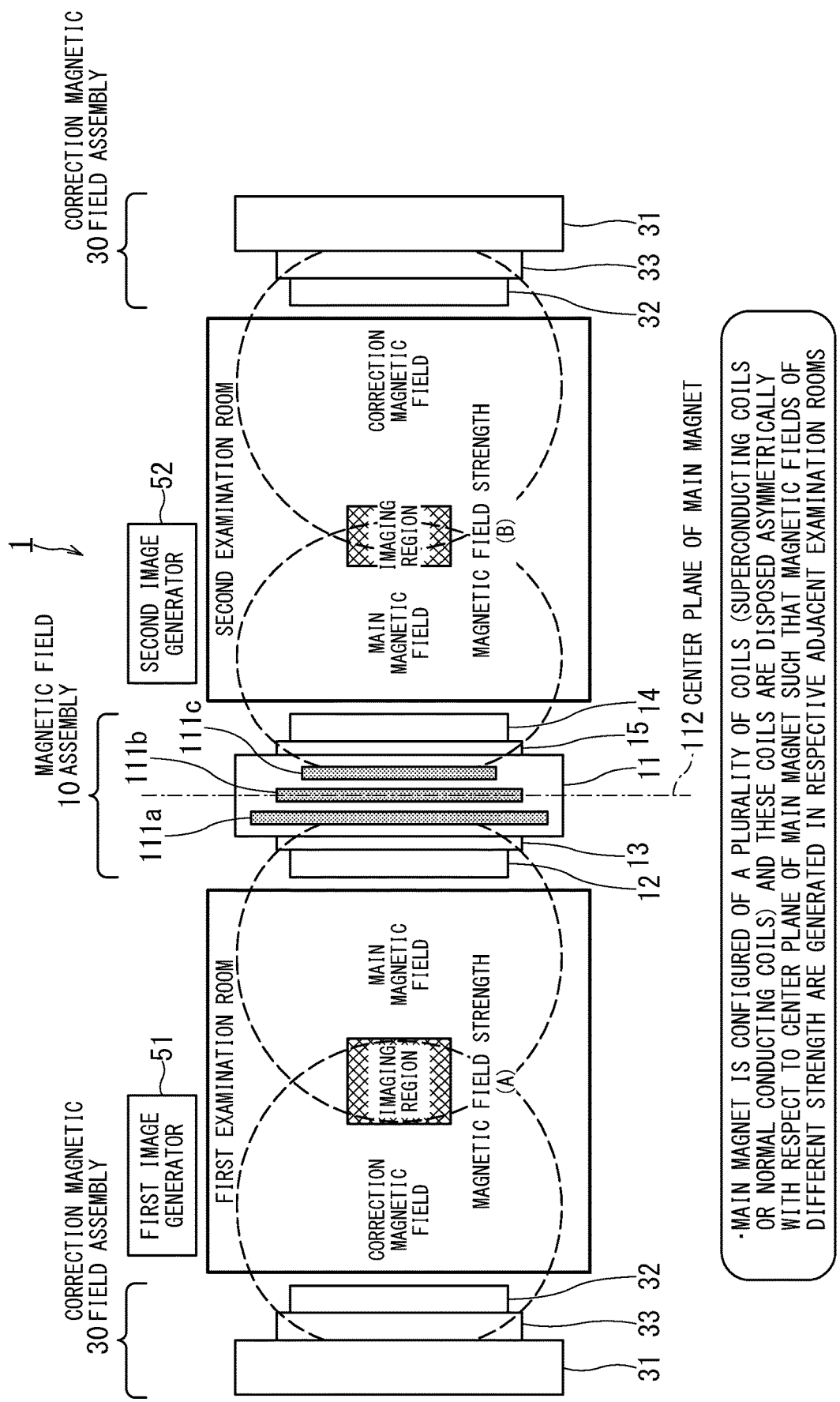
FIG. 6 is a schematic diagram illustrating a configuration of an MRI system according to the second example of the second embodiment.

FIG. 6 is a schematic diagram illustrating a configuration of the MRI system 1 according to the second example of the second embodiment. In the MRI system 1 according to the second example of the second embodiment, the main magnet 11 includes a plurality of superconducting coils or a plurality of normal conducting coils, which are disposed asymmetrically with respect to the central plane of the main magnet 11.

For example, as illustrated in FIG. 6, the main magnet 11 includes superconducting coils 111a, 111b, and 111c that are different from each other in specification such as material, cross-sectional size, coil diameter, and number of turns of the wires constituting the coil. These three superconducting coils 111a, 111b, 111c are disposed asymmetrically with respect to the central plane of the main magnet 11.

Since the plurality of superconducting coils are disposed asymmetrically with respect to the central plane of the main magnet 11, magnetic fields having different magnetic field strengths (A) and (B) are generated in the respective imaging region of the two adjacent examination rooms, and magnetic field distribution having an asymmetric profile with respect to the central plane of the main magnet 11 can be generated for the two adjacent examination rooms.

Figure 7:
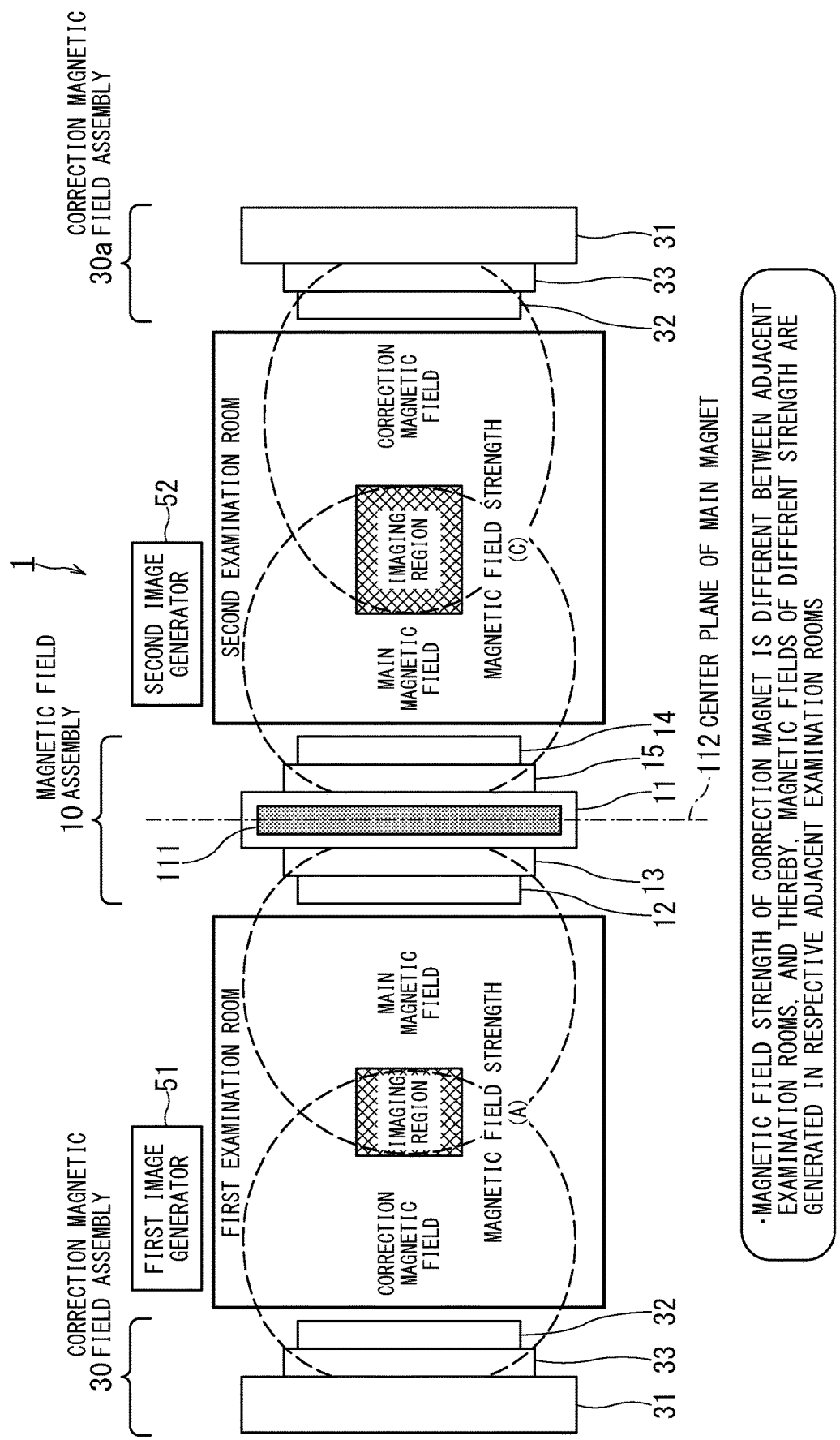
FIG. 7 is a schematic diagram illustrating a configuration of an MRI system according to the third example of the second embodiment.

FIG. 7 is a schematic diagram illustrating a configuration of the MRI system 1 according to the third example of the second embodiment. In the MRI system 1 according to the third example of the second embodiment, the main magnet 11 of the magnetic field assembly 10 is composed of, for example, one superconducting coil 111, and strength of the correction magnetic field to be generated by the correction magnet 31 of each of the correction magnetic field assemblies 30 and 30a is different between the adjacent two examination rooms. As a result, magnetic fields having different magnetic field strengths (A) and (C) can be generated in the respective imaging regions of the two adjacent examination rooms.

Third Embodiment

Figure 8:
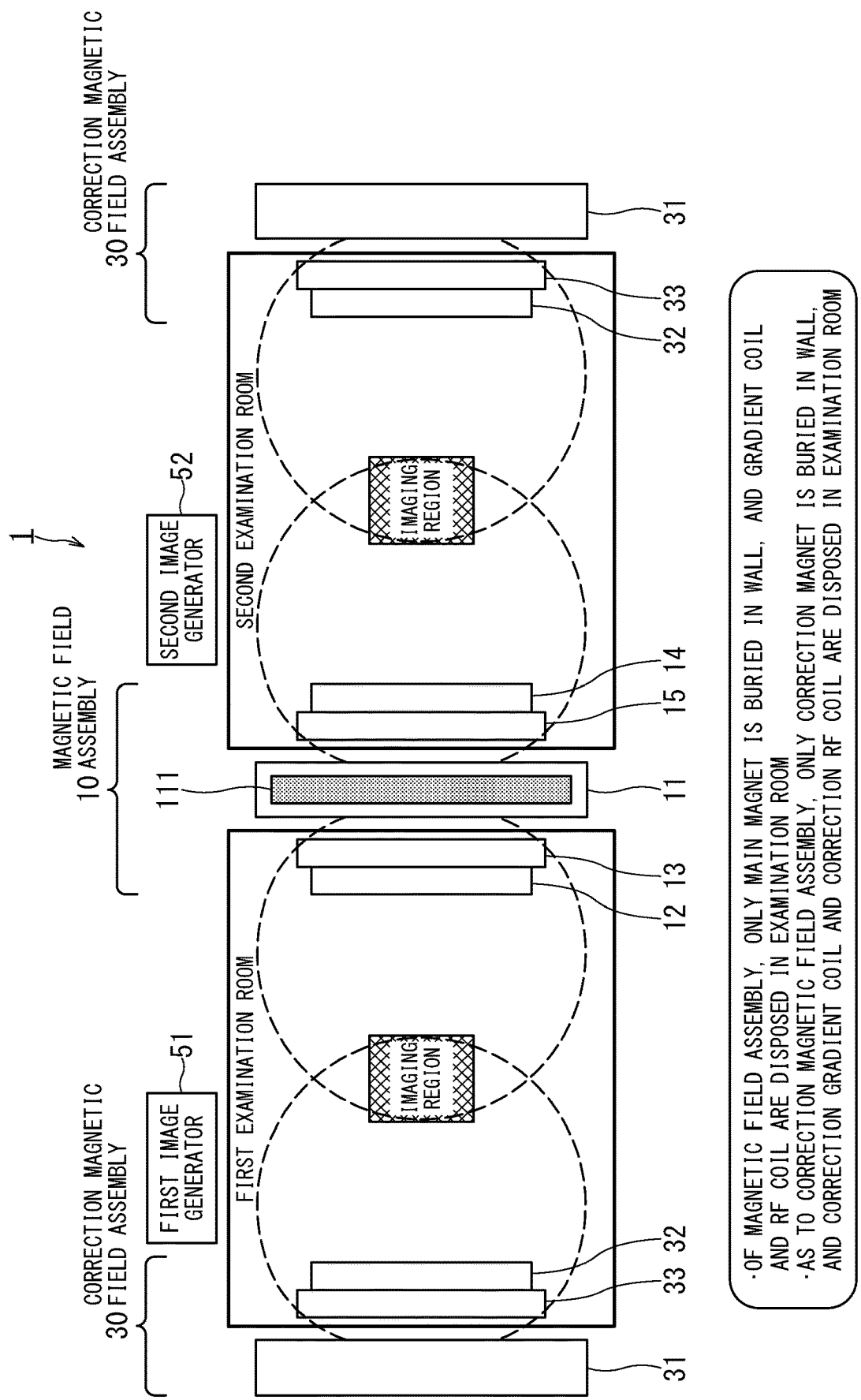
FIG. 8 is a schematic diagram illustrating a configuration of an MRI system according to the third embodiment.

FIG. 8 is a schematic diagram illustrating a configuration of the MRI system 1 according to the third embodiment. Of the components of the magnetic field assembly 10 in the MRI system 1 according to the third embodiment, only the main magnet 11 is disposed in the space between the two adjacent examination rooms, while the gradient coils 13 and 15 as well as the RF coils 12 and 14 are disposed in the corresponding examination room.

For example, only the main magnet 11 is buried in the wall between the two adjacent examination rooms, the first gradient coil 13 and the first RF coil 12 are disposed in the first examination room, and the second gradient coil 15 and the second RF coil 14 are disposed in the second examination room.

As to each correction magnetic field assembly 30, the correction magnet 31 may be buried outside each examination room, for example, buried in the wall that is outside each examination room, while the correction gradient coil 33 and the correction RF coil 32 are disposed inside each examination room as shown in FIG. 8. Alternatively, the entire correction magnetic field assembly 30 including the correction magnet 31 may be disposed inside each examination room.

With the above disposition, the required space between the two adjacent examination rooms or the required space outside the examination room can be narrowed.

Other Embodiments

Figure 9:
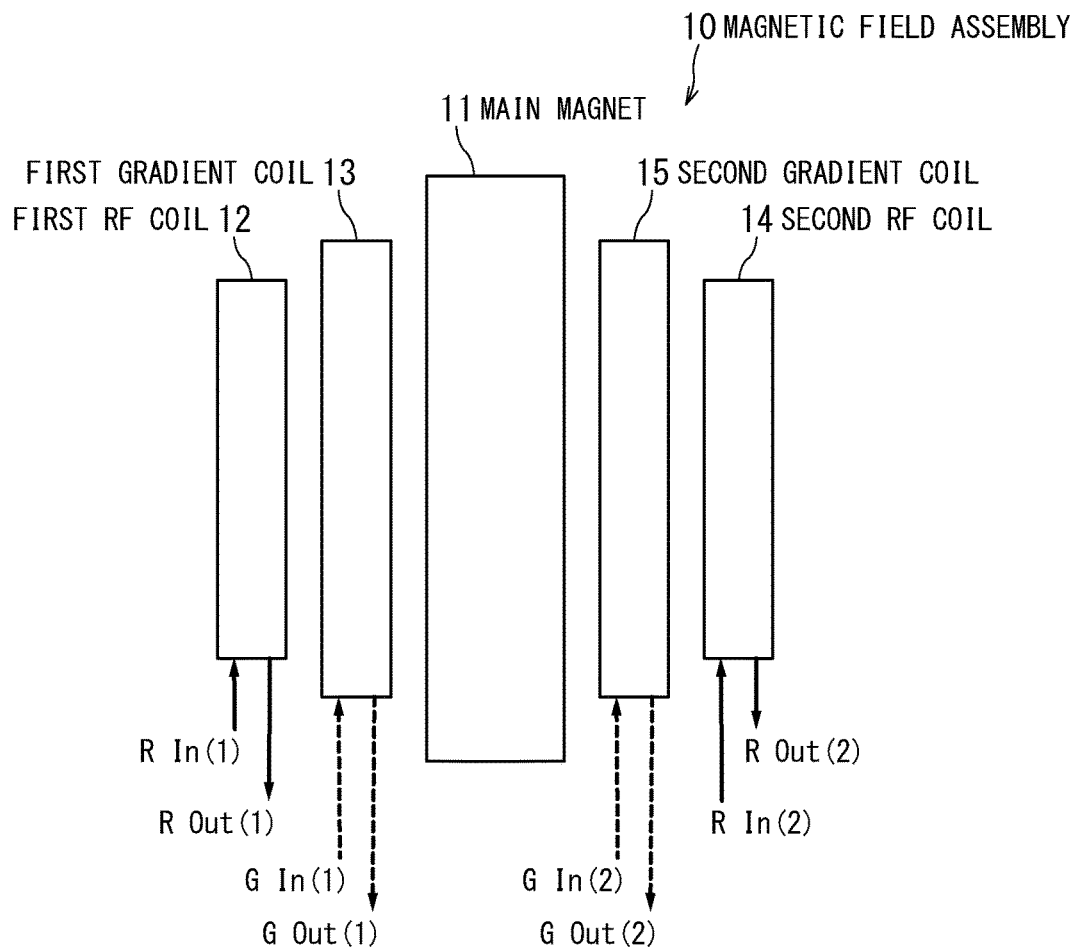
FIG. 9 is a schematic diagram illustrating a configuration in which a gradient magnetic field and a radio frequency magnetic field are independently controlled in two adjacent examination rooms.

FIG. 9, FIG. 10A, and FIG. 10B illustrate a current driving method of the gradient magnetic field coil and the RF coil. FIG. 9 is a schematic diagram illustrating a configuration in which a gradient magnetic field and a radio frequency magnetic field are independently controlled in two adjacent examination rooms.

From two gradient magnetic field power supplies, different gradient magnetic field currents GIn(1)/GOut(1) and GIn(2)/GOut (2) are respectively applied to the first gradient coil 13 for generating the first gradient magnetic field in the first examination room and the second gradient coil 15 for generating the second gradient magnetic field in the second examination room.

Similarly, from the two transmission amplifiers, different RF pulse currents RIn(1)/ROut(1) and RIn(2)/ROut (2) are respectively applied to the first RF coil 12 for applying the first radio frequency magnetic field to the first examination room and the second RF coil 14 for applying the second radio frequency magnetic field to the second examination room.

FIG. 10A and FIG. 10B are schematic diagrams illustrating configurations, in each of which a radio frequency magnetic field is controlled independently in each of the two adjacent examination rooms and the gradient magnetic field is commonly used in the two adjacent examination rooms. FIG. 10A illustrates a configuration in which a common gradient magnetic field current GIn/GOut is applied from one gradient magnetic field power supply to the first gradient coil 13 for the first examination room and the second gradient coil 15 for the second examination room. With such a configuration, the number of gradient magnetic field power supplies can be reduced.

FIG. 10B illustrates a configuration in which not only the gradient magnetic field power supply but also the gradient coil 13 is commonly used by the first examination room and the second examination room. With such a configuration, not only the number of the gradient magnetic field power supplies but also the number of gradient coils can be reduced.

In any of the respective configurations shown in FIG. 9, FIG. 10A, and FIG. 10B, the RF coils can be controlled separately between the first examination room and the second examination room. Thus, RF signal reception timing can be shifted between the adjacent examination rooms, and mutual interference of the RF signal via space or ground can be suppressed.

FIG. 11A and FIG. 11B are schematic diagrams illustrating configurations, in each of which RF shields 16 are provided to further suppress mutual interference of RF signals between adjacent examination rooms. On the adjacent side of both the first examination room and the second examination room, the RF shields 16 are provided between the gradient coils 13, 15 and the RF coils 12, 14.

As shown in FIG. 11A, when the RF coils 12 and 14 are disposed in the space between the first and second examination rooms, one RF shield 16, which is provided so as to surround the first examination room and another RF shield 16 is provided so as to surround the second examination room such that a part of one RF shield 16 is positioned between the gradient coil 13 and the RF coil 12 and a part of the other RF shield 16 is positioned between the gradient coil 15 and the RF coil 14.

As shown in FIG. 11B, when the RF coils 12 and 14 are respectively disposed inside the first examination room and inside the second examination room, one RF shield 16 is provided so as to enclose an interior of the first examination room and another RF shield 16 is provided so as to enclose an interior of the second examination room such that a part of one RF shield 16 is positioned between the gradient coil 13 and the RF coil 12 and a part of the other RF shield 16 is positioned between the gradient coil 15 and the RF coil 14. The RF shields 16 shown in FIG. 11A and FIG. 11B prevent the first radio frequency magnetic field generated by the first RF coil 12 from entering the second examination room, and also prevent the second radio frequency magnetic field generated by the second RF coil 14 from entering the first examination room.

Although a description has been given of the MRI system 1 in each embodiment in a situation where a plurality of examination rooms are adjacent to each other on the same floor of the building, the arrangement of the examination rooms is not limited to above-described disposition. The above-described MRI system 1 can be applied even when a plurality of examination rooms are adjacent to each other in vertical direction as the upper and lower floors of the same building. In such a case, the same effects as the above-described embodiments can be available if the magnetic field assembly 10 is disposed in the space between the first and second examination rooms such as being buried in the floor or ceiling between the first and second examination rooms adjacent to each other in the vertical direction of the building.

Although the main magnet 11 has been described as a thin cylindrical shape (i.e., flat shape) having a predetermined thickness so far, the main magnet 11 is not limited to the flat shape and may have, for example, a bowl shape.

In the MRI system 1 as described above and illustrated in FIG. 2 and FIG. 5 to FIG. 8, for each of the two adjacent examination rooms, a correction magnetic field assembly 30 including the correction magnet 31 is provided inside the side wall (or near the side wall) at a position facing the main magnet 11 between the examination rooms. As described above, the correction magnetic field assembly 30 is provided to ensure the uniformity of the magnetic field distribution in each examination room.

Meanwhile, imaging that does not necessarily require the uniformity of the magnetic field distribution is also possible in some cases. In such imaging, the magnetic field distribution in the examination room may be non-uniform, and for example, magnetic field distribution that changes linearly with respect to the distance from the main magnet 11 can be used. That is, when the magnetic field distribution is non-uniform, images of sufficient quality can be obtained by setting the imaging region to a region where magnetic field strength is within a predetermined range or where magnetic field strength is controllable.

In the case of non-uniform magnetic field distribution in the examination room, in each examination room shown in FIG. 2 and FIG. 5 to FIG. 8, each correction magnetic field assembly 30 provided at a position facing the main magnet 11 is not necessary. Instead, only one magnetic field assembly 10 may be provided between the two adjacent examination rooms for configuring the MRI system 1 that generates magnetic fields and applies RF pulses and gradient magnetic field pulses.

According to at least one of the embodiments described above, the magnetic field generated outside the imaging space can be effectively used in an MRI system using an open magnet MRI apparatus.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An MRI system, comprising:
at least one magnetic field assembly that includes an open main magnet configured to generate a main magnetic field, a plurality of gradient coils configured to generate a gradient magnetic field, and a plurality of RF coils configured to generate a radio frequency magnetic field, the main magnetic field dominantly determining a magnetic resonance frequency; and
at least one image generator configured to generate a magnetic resonance image of an object by using the main magnetic field, the gradient magnetic field, and the radio frequency magnetic field generated by the at least one magnetic field assembly, wherein:
the open main magnet is disposed and fixed between adjacent examination rooms, and generates the main magnetic field while disposed between the adjacent examination rooms;
the main magnetic field generated by the open main magnet while the open main magnet is disposed between the adjacent examination rooms is commonly used in both of the adjacent examination rooms, the open main magnet is disposed between a first examination room and a second examination room adjacent to each other, and configured to generate the main magnetic field common to the first examination room and the second examination room;

the plurality of gradient coils includes a first gradient coil configured to generate a first gradient magnetic field in the first examination room and a second gradient coil configured to generate a second gradient magnetic field in the second examination room;

the plurality of RF coils includes a first RF coil configured to generate a first radio frequency magnetic field in the first examination room and a second RF coil configured to generate a second radio frequency magnetic field in the second examination room; and the open main magnet, the first gradient coil, the second gradient coil, the first RF coil, and the second RF coil are disposed in a space between the first examination room and the second examination room or are buried in a wall between the first examination room and the second examination room.

2. The MRI system according to claim 1, further comprising at least one of a first correction magnet and a second correction magnet, the first correction magnet being provided for the first examination room at a position facing the open main magnet, the second correction magnet being provided for the second examination room at a position facing the open main magnet, wherein the at least one of the first correction magnet and the second correction magnet is configured to generate a correction magnetic field that corrects the main magnetic field.

3. An MRI system, comprising:

at least one magnetic field assembly that includes an open main magnet configured to generate a main magnetic field, a plurality of gradient coils configured to generate a gradient magnetic field, and a plurality of RF coils configured to generate a radio frequency magnetic field, the main magnetic field dominantly determining a magnetic resonance frequency;

at least one of a first correction magnet and a second correction magnet, the first correction magnet being provided for a first examination room at a position facing the open main magnet, the second correction magnet being provided for a second examination room at a position facing the open main magnet, and at least one image generator configured to generate a magnetic resonance image of an object by using the open main magnetic field, the gradient magnetic field, and the radio frequency magnetic field generated by the at least one magnetic field assembly, wherein:

the open main magnet is disposed between adjacent examination rooms;

the main magnetic field generated by the open main magnet is commonly used in each of the adjacent examination rooms;

the open main magnet is disposed between the first examination room and the second examination room adjacent to each other, and configured to generate a magnetic field that constitutes the main magnetic field common to the first examination room and the second examination room;

the plurality of gradient coils includes a first gradient coil configured to generate a first gradient magnetic field in the first examination room and a second gradient coil configured to generate a second gradient magnetic field in the second examination room; and the plurality of RF coils includes a first RF coil configured to generate a first radio frequency magnetic field in the first examination room and a second RF coil configured to generate a second radio frequency magnetic field in the second examination room, the main magnetic field generated by the open main magnet is commonly used in each of the adjacent examination rooms;

the main magnetic field is generated by the open main magnet in a first direction and a second direction, the second direction being opposite to the first direction;

the main magnetic field generated in the first direction constitutes the main magnetic field for one of the adjacent examination rooms; and the at least one of the first correction magnet and the second correction magnet is configured to generate a correction magnetic field that corrects the main magnetic field.

4. The MRI system according to claim 3, wherein:

the open main magnet is disposed in a space between the first examination room and the second examination room or is buried in a wall between the first examination room and the second examination room;

the first gradient coil and the first RF coil are disposed in the first examination room; and the second gradient coil and the second RF coil are disposed in the second examination room.

5. The MRI system according to claim 3, wherein:

the open main magnet includes a superconducting coil or a normal conducting coil; and the main magnetic field is configured to be controllable by electric current to be applied to the superconducting coil or the normal conducting coil.

6. The MRI system according to claim 3, wherein:

the open main magnet includes a superconducting coil; and the superconducting coil is separated from a power supply thereof after the main magnet shifts to a permanent current mode.

7. The MRI system according to claim 3, wherein:

the open main magnet includes a plurality of coils configured to generate the main magnetic field; and each of the plurality of coils is arranged symmetrically with respect to a central plane of the open main magnet orthogonal to a direction of the main magnetic field in such a manner that the main magnetic field generated toward the first examination room is identical in strength as the main magnetic field generated toward the second examination room.

8. The MRI system according to claim 3, wherein a first gradient magnetic field current to be applied to the first gradient coil and a second gradient magnetic field current to be applied to the second gradient coil are independently controlled.

9. The MRI system according to claim 3, wherein a first gradient magnetic field current to be applied to the first gradient coil and a second gradient magnetic field current to be applied to the second gradient coil are controlled by a common power supply.

10. The MRI system according to claim 3, wherein reception timing of a first radio frequency signal using the first RF coil and reception timing of a second radio frequency signal using the second RF coil are controlled independently.

11. The MRI system according to claim 3, further comprising a radio frequency shield that is disposed between the first examination room and the second examination room,
wherein the radio frequency shield is configured to prevent the first radio frequency magnetic field from entering the second examination room and to prevent the second radio frequency magnetic field from entering the first examination room.

12. The MRI system according to claim 3, wherein the first examination room and the second examination room are adjacent to each other on a same floor of a building.

13. The MRI system according to claim 3, wherein:
the open main magnet is disposed and fixed between the adjacent examination rooms, and generates the main magnetic field while disposed between the adjacent examination rooms; and
the main magnetic field generated by the open main magnet while the open main magnet is disposed between the adjacent examination rooms is commonly used in both of the adjacent examination rooms.

14. An MRI system, comprising:
at least one magnetic field assembly that includes an open main magnet configured to generate a main magnetic field, a plurality of gradient coils configured to generate a gradient magnetic field, and a plurality of RF coils configured to generate a radio frequency magnetic field, the main magnetic field dominantly determining a magnetic resonance frequency; and
at least one image generator configured to generate a magnetic resonance image of an object by using the main magnetic field, the gradient magnetic field, and the radio frequency magnetic field generated by the at least one magnetic field assembly, wherein:
the open main magnet is disposed and fixed between adjacent examination rooms, and generates the main magnetic field while disposed between the adjacent examination rooms;
the main magnetic field generated by the open main magnet while the open main magnet is disposed between the adjacent examination rooms is commonly used in both of the adjacent examination rooms;
the open main magnet is disposed between a first examination room and a second examination room adjacent to each other, and configured to generate the main magnetic field common to the first examination room and the second examination room;
the plurality of gradient coils includes a first gradient coil configured to generate a first gradient magnetic field in the first examination room and a second gradient coil configured to generate a second gradient magnetic field in the second examination room;
the plurality of RF coils includes a first RF coil configured to generate a first radio frequency magnetic field in the first examination room and a second RF coil configured to generate a second radio frequency magnetic field in the second examination room;
the open main magnet includes a plurality of coils configured to generate the main magnetic field; and
each of the plurality of coils is disposed asymmetrically with respect to a central plane of the open main magnet orthogonal to a direction of the main magnetic field in such a manner that the main magnetic field generated toward the first examination room is different in strength from the main magnetic field generated toward the second examination room.

15. The MRI system according to claim 14, further comprising at least one of a first correction magnet and a second correction magnet, the first correction magnet being provided for the first examination room at a position facing the open main magnet, the second correction magnet being provided for the second examination room at a position facing the open main magnet,
wherein the at least one of the first correction magnet and the second correction magnet is configured to generate a correction magnetic field that corrects the main magnetic field.

16. An MRI system, comprising:
at least one magnetic field assembly that includes an open main magnet configured to generate a main magnetic field, a plurality of gradient coils configured to generate a gradient magnetic field, and a plurality of RF coils configured to generate a radio frequency magnetic field, the main magnetic field dominantly determining a magnetic resonance frequency; and
at least one image generator configured to generate a magnetic resonance image of an object by using the main magnetic field, the gradient magnetic field, and the radio frequency magnetic field generated by the at least one magnetic field assembly, wherein:
the open main magnet is disposed and fixed between adjacent examination rooms, and generates the main magnetic field while disposed between the adjacent examination rooms;
the main magnetic field generated by the open main magnet while the open main magnet is disposed between the adjacent examination rooms is commonly used in both of the adjacent examination rooms;
the open main magnet is disposed between a first examination room and a second examination room adjacent to each other, and configured to generate the main magnetic field common to the first examination room and the second examination room;
the plurality of gradient coils includes a first gradient coil configured to generate a first gradient magnetic field in the first examination room and a second gradient coil configured to generate a second gradient magnetic field in the second examination room;
the plurality of RF coils includes a first RF coil configured to generate a first radio frequency magnetic field in the first examination room and a second RF coil configured to generate a second radio frequency magnetic field in the second examination room;
the first examination room and the second examination room are adjacent to each other between upper and lower floors of a building; and
the open main magnet, the first gradient coil, the second gradient coil, the first Rf coil, and the second RF coils are disposed in a space between the first examination room and the second examination room or are buried in a floor or a ceiling between the first examination room and the second examination room.

17. The MRI system according to claim 16, further comprising at least one of a first correction magnet and a second correction magnet, the first correction magnet being provided for the first examination room at a position facing the open main magnet, the second correction magnet being provided for the second examination room at a position facing the open main magnet,
wherein the at least one of the first correction magnet and the second correction magnet is configured to generate a correction magnetic field that corrects the main magnetic field.

* * * * *